US012009218B2

(12) United States Patent
Zhou et al.

(10) Patent No.: US 12,009,218 B2
(45) Date of Patent: Jun. 11, 2024

(54) PULSED ETCH PROCESS

(71) Applicant: APPLIED MATERIALS, INC., Santa Clara, CA (US)

(72) Inventors: Yifeng Zhou, Santa Clara, CA (US); Qian Fu, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 98 days.

(21) Appl. No.: 17/738,526

(22) Filed: May 6, 2022

(65) Prior Publication Data
US 2023/0360920 A1 Nov. 9, 2023

(51) Int. Cl.
H01L 21/3065 (2006.01)
(52) U.S. Cl.
CPC ................. H01L 21/3065 (2013.01)
(58) Field of Classification Search
None
See application file for complete search history.

(56) References Cited

U.S. PATENT DOCUMENTS

| 5,888,844 | A | 3/1999 | Bestwick |
| 2007/0099428 | A1 | 5/2007 | Shamiryan |
| 2007/0293043 | A1 | 12/2007 | Singh |
| 2010/0099266 | A1* | 4/2010 | Oswald ............ H01J 37/32045 438/719 |
| 2013/0029490 | A1 | 1/2013 | Lee |
| 2016/0247688 | A1* | 8/2016 | Zhu .................. H01J 37/32357 |
| 2021/0336024 | A1 | 10/2021 | Chen |

FOREIGN PATENT DOCUMENTS

JP          09331117 A      12/1997

OTHER PUBLICATIONS

International Search Report and Written Opinion for Application No. PCT/US2023/020864 dated Aug. 23, 2023, 9 pages.

* cited by examiner

Primary Examiner — Stephanie P Duclair
(74) Attorney, Agent, or Firm — Lowenstein Sandler LLP

(57) ABSTRACT

Described herein is a method for etching a sample. The method includes performing a plasma etch pulse. The plasma etch pulse is performed by directing a gas flow comprising silicon tetrachloride ($SiCl_4$) and a diluent towards the sample. While directing the gas flow, a bias power is applied to achieve a bias state for a first time period. Then, a source power is applied to achieve a source state for a second time period, and then no bias power and no source power is applied to achieve a recovery state for a third time period. The plasma etch pulse is repeated until a target amount of the sample is etched.

16 Claims, 6 Drawing Sheets

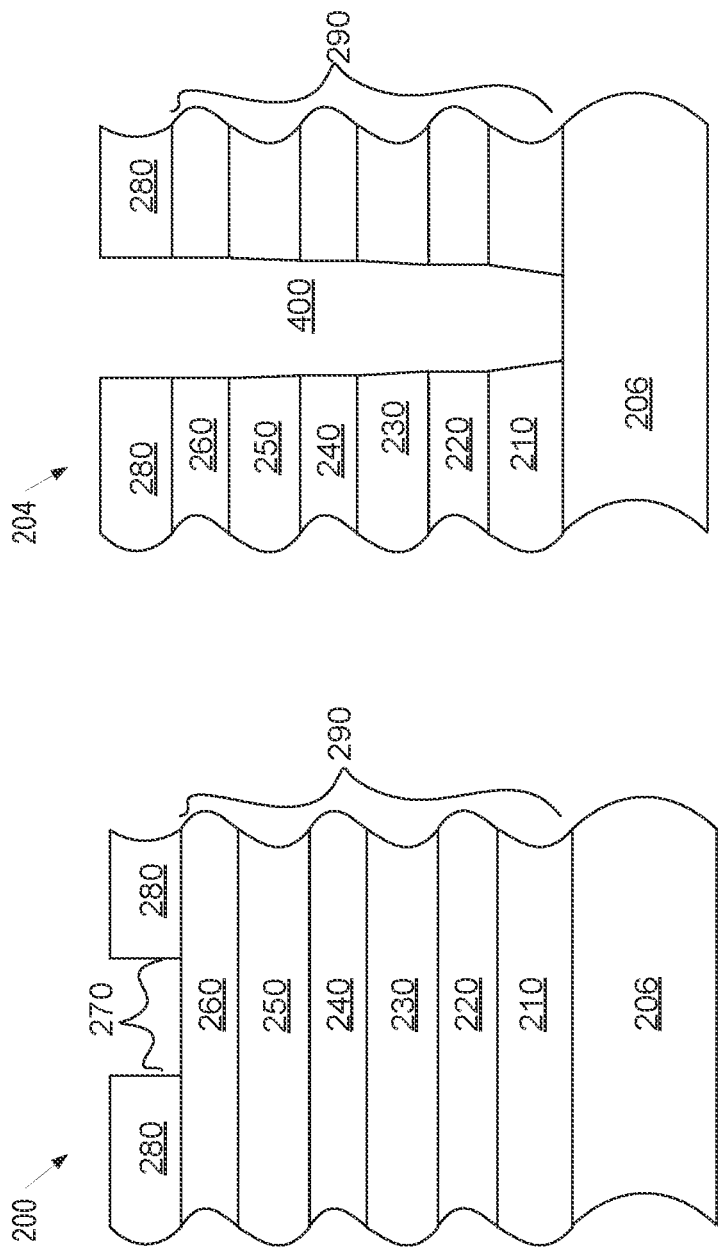

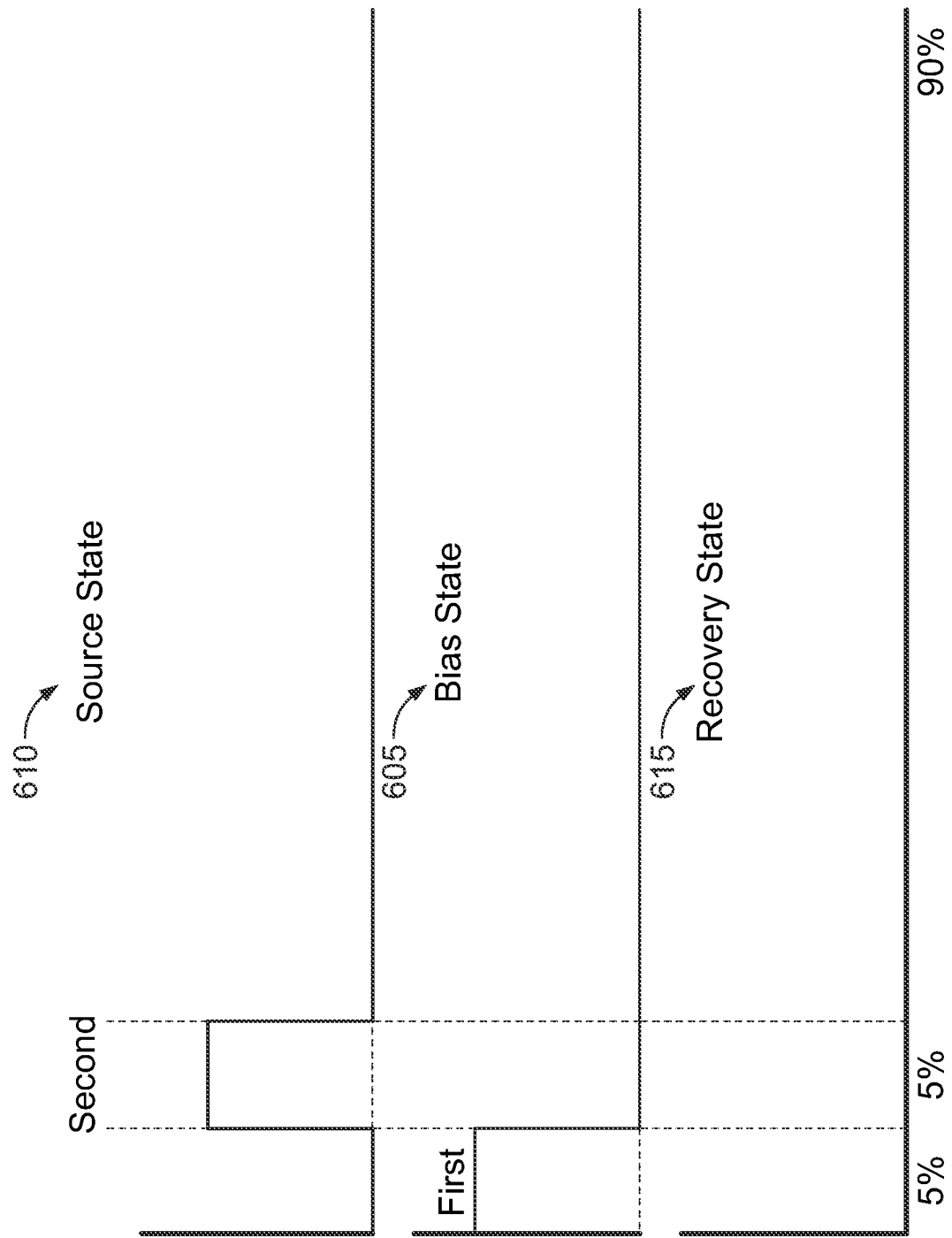

PULSED ETCH PROCESS

TECHNICAL FIELD

Embodiments of the present disclosure relate, in general, to a method for etching a sample, wherein the method includes a pulsed etch process.

BACKGROUND

In the semiconductor industry, devices are fabricated by a number of manufacturing processes producing structures of an ever-decreasing size. As device geometries shrink, controlling the process uniformity and repeatability of devices becomes much more challenging, especially in upstream processes.

In current plasma etching processes, there are a few chemicals used in combination with a pulsed source and bias voltage. The chemicals include chlorine (Cl), hydrogen bromide (HBr), or a combination thereof. These plasma etching processes generally have a two state system, wherein a source power is applied in the first state followed by a bias power that is applied in a second state. These systems have been found to produce a V-shape profile in a sample after the plasma etch is performed. The V-shape that is formed in etched substrates results in undesirable device performance due to the variation in the width of devices over depth. Thus, there is a need to improve plasma etching processes such that there is a more uniform profile throughout the depth of a sample, such as a straighter profile.

SUMMARY

In some embodiments of the present disclosure, a method of etching a sample is provided. The method may include performing a plasma etch pulse. In some embodiments, the plasma etch pulse may include directing a gas flow including silicon tetrachloride ($SiCl_4$) and a diluent towards the sample; applying a bias power to achieve a bias state for a first time period while directing the flow of the $SiCl_4$ and the diluent towards the sample; applying a source power to achieve a source state for a second time period; and applying no bias power and no source power to achieve a recovery state for a third time period. In some embodiments of the method, the plasma etch pluse may be repeated until a target amount of the sample has been etched.

In another embodiment of the present disclosure, a method of etching a substrate is provided, where the substrate may include a stack of alternating layers of Si and SiGe. The method may include causing a chamber including a substrate to reach a pressure of about 0.1 mT to about 500 mT; causing the substrate to reach a temperature of about −50° C. to about 300° C.; generating a plasma from a gas flow including silicon tetrachloride ($SiCl_4$) and a diluent including argon (Ar), helium (He) or a mixture thereof; and directing the plasma towards the substrate to etch the stack of alternating layers of Si and SiGe on the substrate.

In yet another embodiment of the present disclosure, a method of etching a sample is provided including performing a plasma etch pulse and repeating the plasma etch pulse until a target amount of the sample has been etched. The performing a plasma etch pulse of the method may include applying a bias power to achieve a bias state for a first time period while directing a flow of a gas and a diluent towards the sample; applying a source power to achieve a source state for a second time period; and applying no bias power and no source power to achieve a recovery state for a third time period.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 2A depicts a sectional view of one embodiment of multiple layers of a sample;

FIG. 2B depicts a sectional view of one embodiment of multiple layers of a sample where the sample has been etched to have a U-profile;

FIG. 6 represents a plasma etch pulse according to an embodiment of the present disclosure.

DETAILED DESCRIPTION

Figure 1:
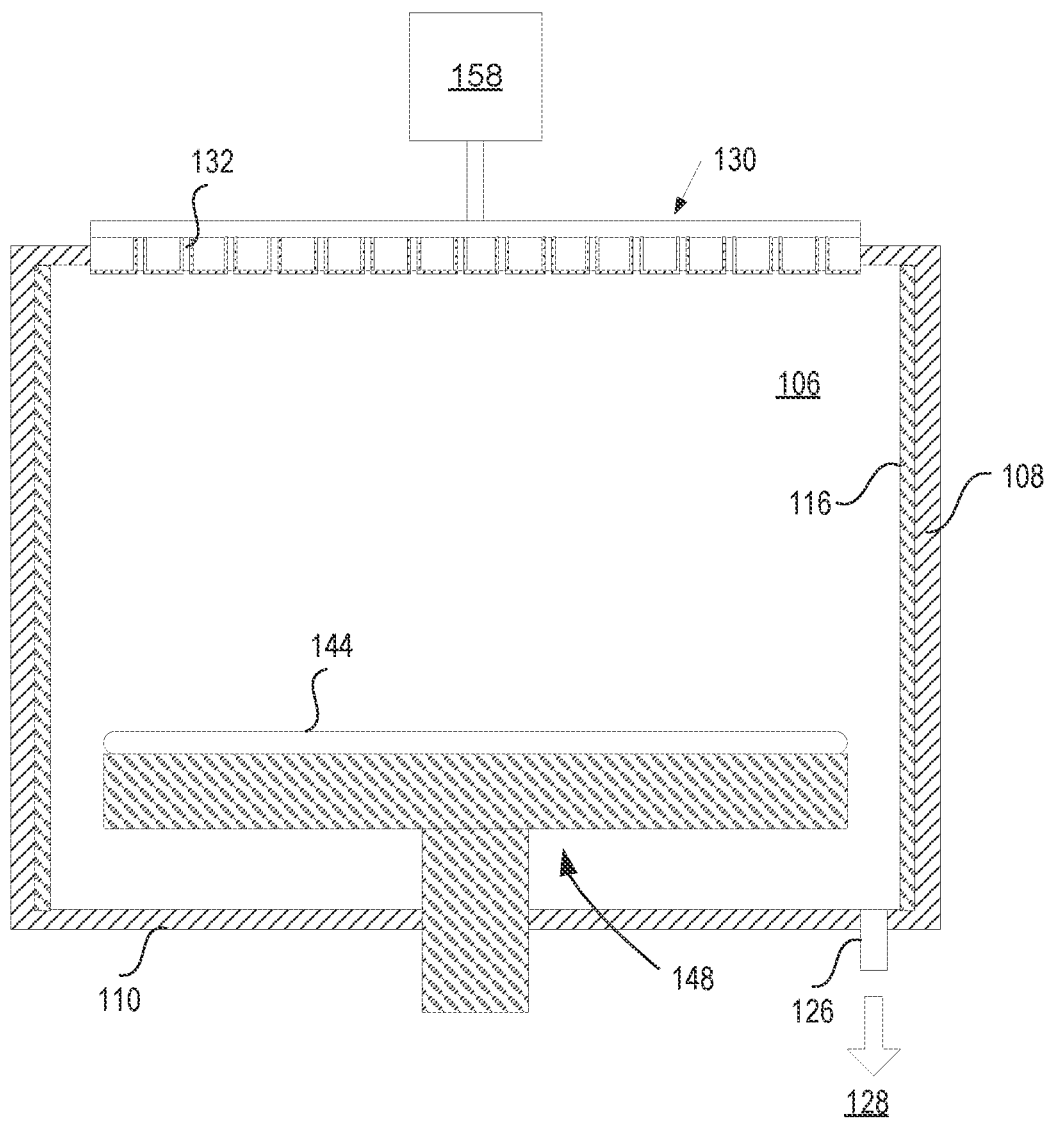
FIG. 1 depicts a sectional view of one embodiment of a processing chamber.

Embodiments disclosed herein describe a method for etching a sample. The method for etching a sample may include performing a plasma etch pulse, which includes directing a gas flow including silicon tetrachloride ($SiCl_4$) and a diluent towards a sample. To improve the profile of the sample, $SiCl_4$ may be used in combination with a three stage plasma etch pulse process. The use of $SiCl_4$ in combination with the three stage plasma etch pulse of the present disclosure was found to produce lower variability in trench width across a depth of trenches in etched samples (i.e., substrates) when compared to traditional plasma etch processes that use chlorine ($Cl_2$), hydrogen bromide (HBr), and/or nitrogen ($N_2$).

In the plasma etch process of the present disclosure, a three state pulsing scheme may be used. In the three state pulsing scheme, a first state may be a bias state in which a bias power is applied. The first state may last for a first time period. In some embodiments, the bias power may have a power of about 100 W to about 5000 W, and may be applied with a bias frequency of about 400 kHz to about 60 MHz. The second state of the pulsing scheme may be a source state, in which a source power may be applied for a second period of time while no bias power is applied. The source power may be about 100 W to about 5000 W in embodiments. The third state may be a recovery state in which neither bias power nor source power are applied for a third time period. During etching multiple plasma etch pulses may be applied until a target etch depth has been achieved.

Traditional plasma etch processes apply a source power prior to application of a bias power, and use a two state pulsing scheme. It has been found that applying a bias power before a source power, as is performed in embodiments herein, is advantageous for generation of a capacitively coupled plasma. It has further been found that following a bias state with a source state, where only source power is applied, allows for mask preservation of an etch mask on the substrate because the gas chemistry of $SiCl_4$ in combination with Ar and He and the source power causes a protective layer to be deposited on the sample. The protective layer aids in reserving the etch mask (e.g., which may be a hard mask) of the sample and increases a selectivity between silicon and the etch mask. It has additionally been found that when the source power is turned off, electron density and electron temperature will drop rapidly. Accordingly, by introducing the recovery state after the source state, when the plasma etch pulse is repeated the electron temperature of the next iteration of the first state will be lower than that of the second state. The inventors have found that this drop in electron temperature correlates to a lower ion temperature, which allows for better directional control when etching. Thus, if the third state are not present in the plasma etch pulse, then the plasma density and electron temperature will remain high after applying a source power. If the electron temperature is high, then the ion temperature will also be high. When there is a high ion temperature, then there is more random motion of the ions in the bulk plasma, causing a broader angular distribution and more variability in the etch profile. Accordingly, the three state etch pulse that includes first a bias state, followed by a source state, and followed by a recovery state has been found to provide improved directional control for etching a sample, and in particular for etching a sample comprising an alternating stack of Si and SiGe layers when used with an $SiCl_4$ chemistry.

Thus, embodiments of the method for etching according to the present disclosure allow for more directional etching in the first state, i.e. applying a bias power, at least in part because the plasma is cooled down in the third state prior to a next pulse.

Disclosed herein are embodiments of a method for etching a sample including performing a plasma etch pulse and repeating the plasma etch pulse until a target amount of the sample has been etched. The plasma etch pulse may include directing a gas flow including $SiCl_4$ and a diluent towards the sample; applying a bias power to achieve a bias state for a first time period while directing the flow of $SiCl_4$ and the diluent towards the sample; subsequently applying a source power to achieve a source state for a second time period; and subsequently applying no bias power and no source power to achieve a recovery state for a third time period. In some embodiments, no source power is applied during the bias state and no bias power is applied during the source state.

In some embodiments, the bias power may be from about 100 watts (W) to about 5,000 watts (W), from about 200 W to about 2,000 W, from about 300 W to about 1,500 W, from about 500 W to about 1,250 W, or from about 600 W to about 1,000 W.

Some embodiments are described herein with reference to a sample containing alternating silicon (Si) and silicon germanium (SiGe) layers. The sample may include a gate all around transistor, which may be etched using a method according to an embodiment of the present disclosure. The method described herein can also be beneficially used to etch many other types of substrates, such as those having Si and/or SiGe layers.

Referring now to the figures, FIG. 1 is a sectional view of a processing chamber 100 (e.g., a semiconductor processing chamber) having one or more chamber components in accordance with embodiments of the present disclosure. The processing chamber 100 may be used for processes in which a corrosive plasma environment and/or corrosive chemistry is provided. For example, the processing chamber 100 may be a chamber for a plasma etch reactor (also known as a plasma etcher). Examples of chamber components that may be exposed to plasma in the processing chamber 100 are a substrate support assembly 148, an electrostatic chuck (ESC), a ring (e.g., a process kit ring or single ring), a chamber wall, a base, a showerhead 130, a gas distribution plate, a liner, a liner kit, a shield, a plasma screen, a flow equalizer, a cooling base, a chamber viewport, a chamber lid, a nozzle, process kit rings, and so on.

In one embodiment, the processing chamber 100 includes a chamber body 102 and a showerhead 130 that enclose an interior volume 106. The showerhead 130 may or may not include a gas distribution plate. For example, the showerhead may be a multi-piece showerhead that includes a showerhead base and a showerhead gas distribution plate bonded to the showerhead base. Alternatively, the showerhead 130 may be replaced by a lid and a nozzle in some embodiments, or by multiple pie shaped showerhead compartments and plasma generation units in other embodiments. The chamber body 102 may be fabricated from aluminum, stainless steel or other suitable material. The chamber body 102 generally includes sidewalls 108 and a bottom 110. Any of the showerhead 130 (or lid and/or nozzle), sidewalls 108 and/or bottom 110 may include the multi-layer plasma resistant coating.

An outer liner 116 may be disposed adjacent the sidewalls 108 to protect the chamber body 102. The outer liner 116 may be a halogen-containing gas resist material such as $Al_2O_3$ or $Y_2O_3$. The outer liner 116 may be coated with the multi-layer plasma resistant ceramic coating in some embodiments.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewalls 108 of the chamber body 102 and/or on a top portion of the chamber body. The showerhead 130 (or lid) may be opened to allow access to the interior volume 106 of the processing chamber 100, and may provide a seal for the processing chamber 100 while closed. A gas panel 158 may be coupled to the processing chamber 100 to provide process and/or carrier gases to the interior volume 106 through the showerhead 130 or lid and nozzle. Examples of process gas that may be delivered by the gas panel 158 and used to process substrates/samples in the processing chamber 100 include a silicon containing gas, such as silicon tetrachloride ($SiCl_4$). Examples of carrier gases (also referred to herein as a diluent) include $N_2$, He, Ar, and other gases inert to process gases (e.g., non-reactive gases). The showerhead 130 includes multiple gas delivery holes 132 throughout the showerhead 130. The showerhead 130 may be or may include aluminum, anodized aluminum, an aluminum alloy (e.g., Al 6061), or an anodized aluminum alloy. In some embodiments, the showerhead includes a gas distribution plate (GDP) bonded to the showerhead. The GDP may be, for example, Si or SiC. The GDP may additionally include multiple holes that line up with the holes in the showerhead.

A substrate support assembly 148 is disposed in the interior volume 106 of the processing chamber 100 below the showerhead 130. The substrate support assembly 148 holds a substrate 144 (e.g., a wafer) during processing. The substrate support assembly 148 may include an electrostatic chuck that secures the substrate 144 during processing, a metal cooling plate bonded to the electrostatic chuck, and/or one or more additional components. An inner liner may cover a periphery of the substrate support assembly 148. The inner liner may be a halogen-containing gas resist material such as $Al_2O_3$ or $Y_2O_3$. The substrate support assembly, portions of the substrate support assembly, and/or the inner liner may be coated with the metal layer and barrier layer in some embodiments.

The processing chamber 100 may be an etch chamber configured to perform a pulsed etch process described herein. In embodiments, the pulsed etch process is performed to etch one or more layers disposed on the substrate 144. For example, the substrate 144 may be a semiconductor wafer, a glass plate, a SiGe wafer, or another type of substrate. In one embodiment, the one or more layers 144 disposed on the substrate include a stack of alternating layers of Si and Ge.

FIG. 2A displays a sectional view of an article 200 including a substrate 206 having a stack of alternating silicon (Si) layers and silicon germanium (SiGe) layers. In one embodiment, article 200 corresponds to substrate 144 of FIG. 1. The substrate 206 includes Si layers 260, 240, 220 and SiGe layers 250, 230, 210 disposed thereon in a stack 290. The Si layers and SiGe layers may be in the form of nanosheets (e.g., layers having thicknesses on the scale of nm) in some embodiments. The Si layers may be 0% to 200% thicker than the SiGe layers in one embodiment. In one embodiment, the Si layers are approximately 20% thicker than the SiGe layers. In one embodiment, all of the Si layers have approximately the same thickness, and all of the SiGe layers may have approximately the same thickness, which may be different than the Si layer thickness. Alternatively, different Si layers may have different thicknesses and/or different SiGe layers may have different thicknesses. In other embodiments, the Si layers and the SiGe layers may have about the same thickness to one another.

A pattern mask 280 (also referred to as an etch mask) may cover a top layer 260 in the stack 290. The pattern mask 280 may be a soft mask or a hard mask. Some hard masks that may be used include a polysilicon hard mask and a metal hard mask such as a tungsten hard mask or a titanium nitride hard mask. Pattern mask 280 includes open areas 270 which expose underlying layers to etch chemicals during etching processes. The pattern mask 280 additionally includes covered regions that protect underlying layers from etch chemicals. Regions of the stack 290 under the open areas 270 that are not protected by the pattern mask 280 may undergo an etching process.

The article 200 can be etched through the pattern mask 280 to create cavities or trenches having approximately the shape of the openings in the pattern mask 280. Etchants will typically also etch the pattern mask 280 at some etch rate.

Figure 5:
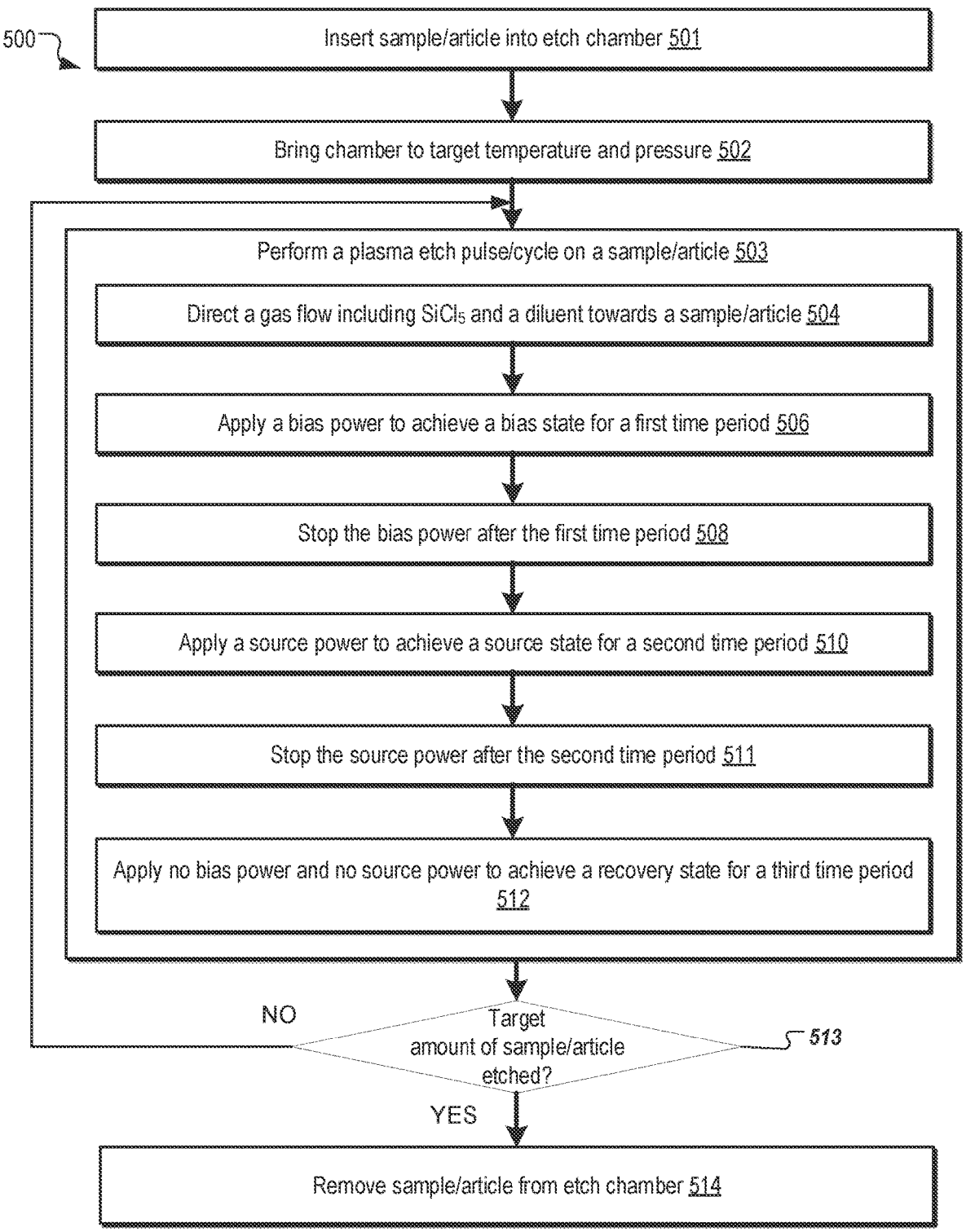
FIG. 5 is a flow chart representing a method for etching a sample according to an embodiment of the present disclosure.

FIG. 2B shows a sectional view of an article 204 including the substrate 206 having the stack of alternating Si layers 260, 240, 220 and SiGe layers 250, 230, 210 that has undergone an etch process according to embodiments of the present disclosure, and in particular according to the method described in FIG. 5. The process has etched a cavity 400 in the Si layers and in the SiGe layers. In one embodiment, the cavity 400 has a tapered cross sectional shape in which a bottom of the cavity is slightly narrower than a top of the cavity, having a U-profile. Notably, the sidewalls of trenches or holes formed from the etching process set forth in embodiments herein are nearly vertical, as opposed to sidewalls produced by prior etching processes.

Figure 3B:
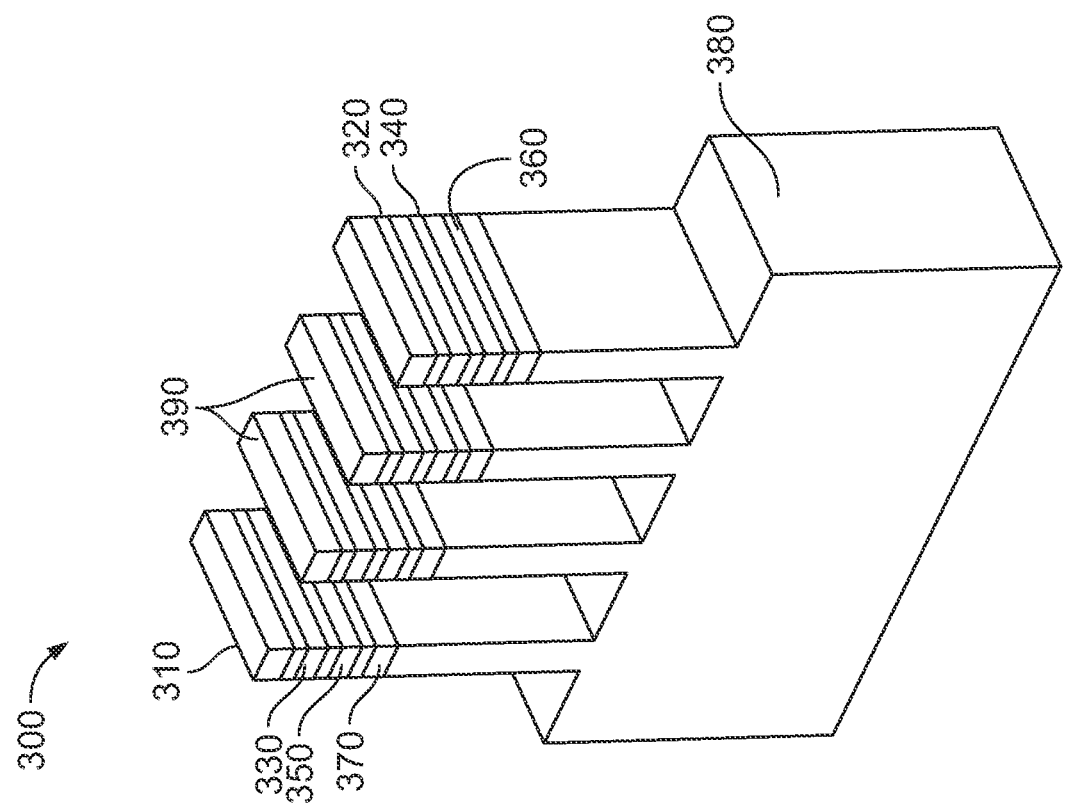
FIG. 3B illustrates the sample of FIG. 3A after having been etched according to an embodiment of the present disclosure.
Figure 3A:
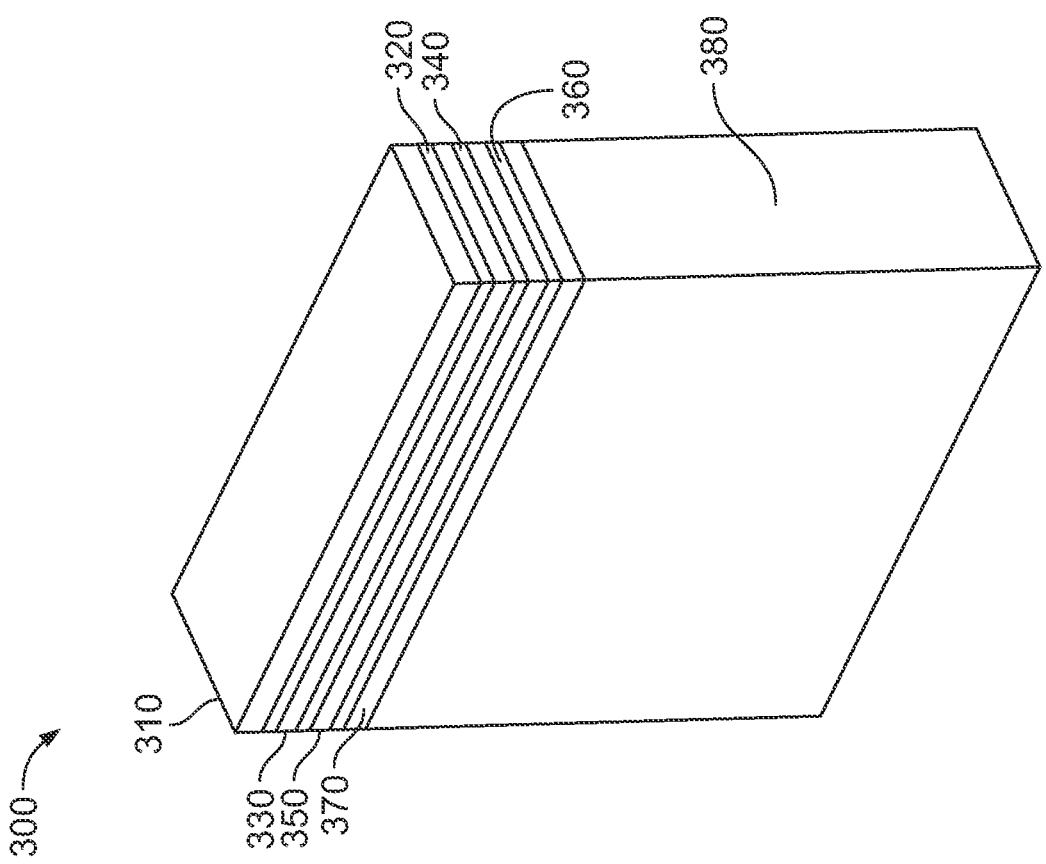
FIG. 3A illustrates a sample having multiple layers to be etched.

FIG. 3A illustrates a sample having multiple layers to be etched, and may correspond to a perspective view of article 204 in embodiments. FIG. 3B illustrates the sample of FIG. 3A after having been etched in a first etch process according to an embodiment of the present disclosure.

Figure 4B:
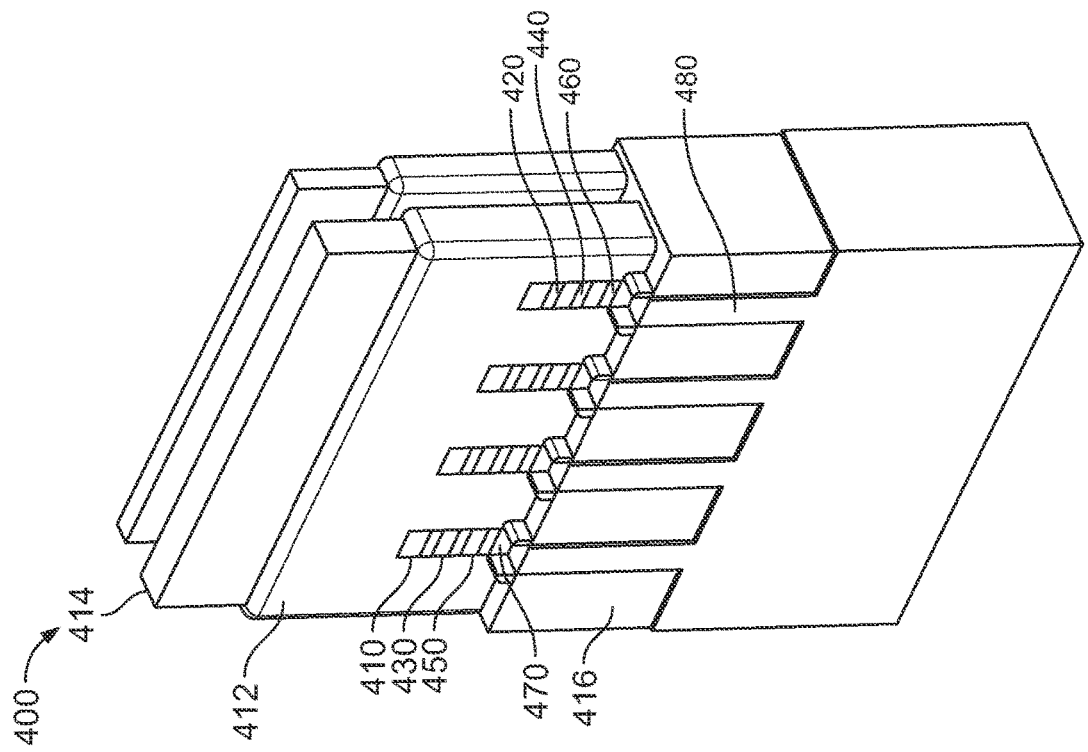
FIG. 4B illustrates the sample FIG. 4A after having been etched according to an embodiment of the present disclosure.
Figure 4A:
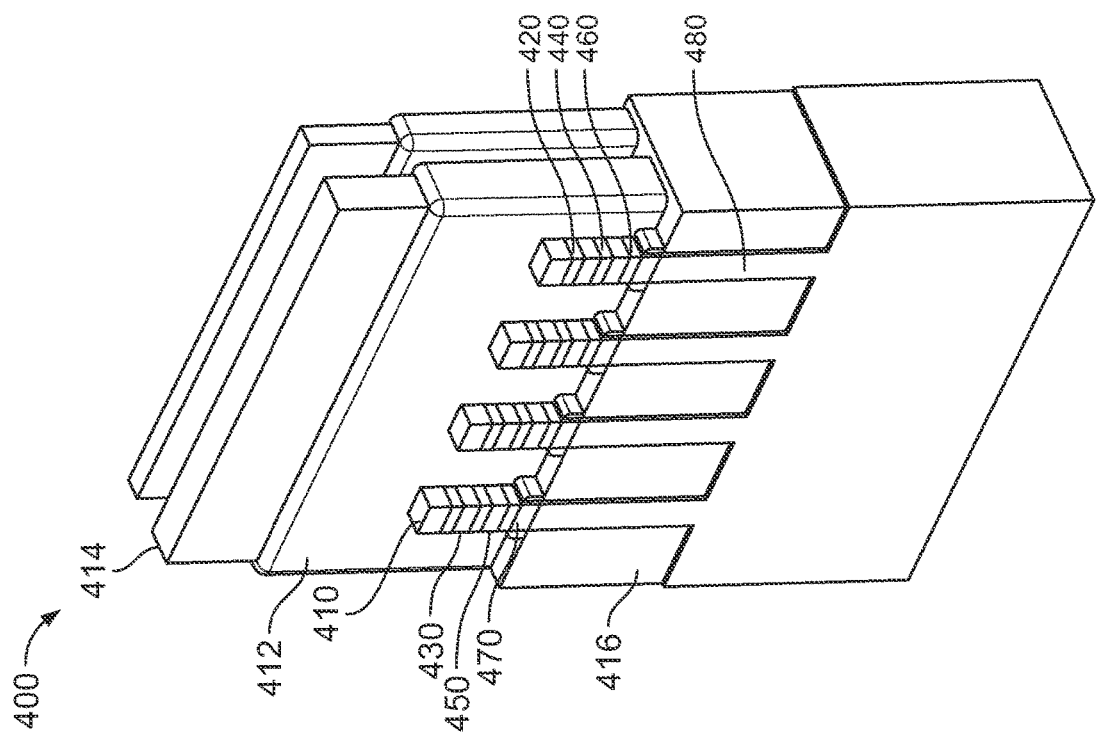
FIG. 4A illustrates the sample of FIG. 3B after further layers have been deposited and prior to an etch process.

FIG. 4A illustrates the sample of FIG. 3B after further layers have been deposited and prior to a second etch process. FIG. 4B illustrates the sample FIG. 4A after having been etched in the second etch process according to an embodiment of the present disclosure.

In FIG. 3A, an article 300, such as a gate all around transistor, is illustrated. The article 300 includes a stack of alternating Si layers 310, 330, 350, 370 and SiGe layers 320, 340, 360. The layers of the article 300 may be stacked on a substrate 380, wherein the substrate 380 may formed from SiGe, Si, glass, or another material. The Si layers 310, 330, 350, 370 and SiGe layers 320, 340, 360 may be in the form of nanosheets in embodiments. The Si layers may be 0% to 200% thicker than the SiGe layers in one embodiment. In one embodiment, the Si layers are approximately 20% thicker than the SiGe layers. In one embodiment, all of the Si layers have approximately the same thickness, and all of the SiGe layers may have approximately the same thickness, which may be different than the Si thickness. Alternatively, different Si layers may have different thicknesses and/or different SiGe layers may have different thicknesses. In other embodiments, the Si layers and the SiGe layers may have about the same thickness. The article 300 of FIG. 3A may be etched according to the method 500 of FIG. 5 after a pattern mask (now shown) is deposited over a top layer (e.g., Si layer 310 in the illustration). FIG. 3B represents the article 300 after being etched according to the method 500 of FIG. 5. As can be seen in FIG. 3B, the Si layers 310, 330, 350, 370 and SiGe layers 320, 340, 360 are etched to create multiple spaces (e.g., trenches) 390. A single space 390 may be etched, or multiple spaces may be etched.

In FIG. 4A, an article 400, such as a gate all around transistor, is illustrated according to an embodiment of the present disclosure. The article 400 may include a pattern mask 414 (e.g., a hard mask) and a spacer 412. The spacer 412 may be approximately orthogonal to trenches 490 (e.g., that may correspond to trenches 390 of FIG. 3B). The pattern mask 414 may be along the entire length of the spacer 412, or partially along the length of the spacer 412. Multiple spacers 412 may be offset from one another by a gap 492. Only two spacers are shown, but a device under manufacture would generally include many such spacers. The spacer 412 may surround the Si layers 410, 430, 450, 470 and SiGe layers 420, 440, 460. The article 400 may also include a shallow trench isolation 416 formed in or on a substrate 480, wherein the substrate may be formed of SiGe, Si, glass, or another material. The article 400 may be etched according to the method 500 of FIG. 5 in embodiments. FIG. 4B represents an article 400 that has undergone etching according to embodiments described herein. In FIG. 4B, the Si layers 410, 430, 450, 470 and SiGe layers 420, 440, 460 have been etched to remove any excess layers from outside the spacer 412. That way, the Si and SiGe layers may be about flush against the spacer 412 so that there is no Si and/SiGe layer outside of the spacer 412.

FIG. 5 is a flow chart representing a method 500 of etching a sample and/or an article according to an embodiment of the present disclosure. In the method 500, at block

501, a sample and/or article is inserted into an etch chamber. The etch chamber may be a plasma etch chamber. In block 502, the chamber is brought to a target temperature and pressure (e.g., using one or more heating elements and/or a pump). The pressure of the chamber may be from about 0.1 mT to about 500 mT, from about 1 mT to about 400 mT, from about 5 mT to about 300 mT, from about 10 mT to about 200 mT, from about 25 mT to about 100 mT, or from about 1 mT to about 100 mT, or any sub range or value herein. The temperature of chamber may be from about −50° C. to about 300° C., from about −25° C. to about 250° C., from about 0° C. to about 120° C., from about 25° C. to about 100° C., or from about 50° C. to about 75° C., or any sub range or value herein. In one embodiment, the target substrate temperature is at least 40° C. It has been found that temperatures below 40° C. can result in increased iso-dense etch rate loading.

When the target temperature and pressure are reached, a plasma etch process may proceed by forming a plasma comprising $SiCl_4$ and one or more additional gases (e.g., carrier gases or diluents). The plasma etch process may be a pulsed plasma etch process. In one embodiment, a plasma etch pulse/cycle is performed on a sample and/or an article at block 503. The plasma etch pulse is performed by directing a gas flowing including $SiCl_4$ and a diluent towards the sample and/or the article in block 504. The total gas feed flow of the $SiCl_4$ and diluent is from about 50 sccm to about 2000 sccm, from about 100 sccm to about 1500 sccm, from about 150 sccm to about 1250 sccm, from about 200 sccm to about 1000 sccm, from about 250 sccm to about 750 sccm, or any sub range or value herein. The amount of $SiCl_4$ in the total gas feed flow is from about 5 mol % to about 80 mol %, from about 5 mol % to about 70 mol %, from about 5 mol % to about 60 mol %, from about 5 mol % to about 50 mol %, from about 5 mol % to about 40 mol %, from about 10 mol % to about 80 mol %, from about 10 mol % to about 70 mol %, from about 20 mol % to about 70 mol %, from about 20 mol % to about 60 mol %, from about 30 mol % to about 50 mol %, or any sub range or value herein.

The diluent may include Ar, He, or a combination thereof. The diluent may additionally or alternatively include one or more additional inert gases. The amount of Ar in the total gas feed flow may be from about 5 mol % to about 15 mol %, from about 7.5 mol % to about 12.5 mol %, or from about 9 mol % to about 11 mol %, or any sub range or value herein. The amount of He in the total gas feed flow may be from about 5 mol % to about 90 mol %, from about 10 mol % to about 80 mol %, from about 15 mol % to about 75 mol %, from about 25 mol % to about 65 mol %, from about 30 mol % to about 60 mol %, from about 35 mol % to about 55 mol %, or any sub range or value herein.

At block 506, a bias power is applied to the sample/article to achieve a bias state for a first time period. The bias power may be from about 10 watts (W) to about 5,000 watts (W), from about 200 W to about 2,000 W, from about 300 W to about 3,000 W, from about 400 W to about 2,500 W, from about 500 W to about 2,000 W, from about 600 W to about 1,500 W, or from about 750 W to about 1,250 W, or any sub range or value herein. A higher bias power results in a straighter profile (e.g., more vertical profile on the trench sidewalls) with reduced profile bowing and lower selectivity to a pattern mask. The bias power may be a time-average power. The bias frequency may be from about 400 kHz to about 60 MHz, from about 400 kHz to about 40 MHz, from about 400 kHz to about 35 MHz, from about 400 kHz to about 27 MHz, from about 400 kHz to about 20 MHz, or from about 800 kHz to about 10 MHz, or any sub range or value herein. Two example frequencies that may be used are 13 MHz and 2 MHz. It was shown that the 2 MHz frequency may provide a lower selectivity to the pattern mask than the 14 MHz frequency. The first time period that the bias power is applied is from about 10 μsec to about 1 msec, from about 30 μsec to about 1 msec, from about 50 μsec to about 1 msec, from about 70 μsec to about 1 msec, or from about 85 μsec to about 1 msec, or any sub range or value herein. At block 508, the bias power is stopped after the first time period ends.

After stopping the bias power, a source power is then applied to achieve a source state for a second time period in block 510. The source power may be from about 10 W to about 5000 W, from about 200 W to about 2,000 W, from about 300 W to about 3,000 W, from about 400 W to about 2,500 W, from about 500 W to about 2,000 W, from about 600 W to about 1,500 W, or from about 750 W to about 1,250 W, or any sub range or value herein. The source power may be a time-average source power (e.g., source power times duty cycle). The source frequency may be about 10 MHz to about 15 MHz, or about 13 MHz, or any sub range or value herein.

In some embodiments, the second time period that the source power may be applied for is from about 10 μsec to about 1 msec, from about 30 μsec to about 1 msec, from about 50 μsec to about 1 msec, from about 70 μsec to about 1 msec, or from about 85 μsec to about 1 msec, or any sub range or value herein.

In some embodiments, a ratio of the first time period to the second time period is from about 1:10 to about 10:1, from about 1:9 to about 9:1, from about 1:8 to about 8:1, from about 1:7 to about 7:1, from about 1:6 to about 6:1, from about 1:5 to about 5:1, from about 1:4 to about 4:1, from about 1:3 to about 3:1, from about 1:2 to about 2:1, or about 1:1, or any sub range or value herein.

After the second time period of block 510 ends, the source power is stopped in block 511. Then, no bias power and no source power is applied in the chamber so as to achieve a recovery state for a third time period in block 512. The third time period may be from about about 10 μsec to about 1 msec, from about 50 μsec to about 1 msec, from about 60 μsec to about 1 msec, from about 70 μsec to about 1 msec, from about 80 μsec to about 1 msec, or from about 85 μsec to about 1 msec, or any sub range or value herein.

In some embodiments, a ratio of the third time period to an aggregate of the first time period and the second time period is from about 1:1 to about 90:1, from about 1:1 to about 80:1, from about 1:1 to about 70:1, from about 1:1 to about 60:1, from about 1:1 to about 50:1, from about 1:1 to about 40:1, from about 1:1 to about 30:1, from about 1:1 to about 20:1, from about 1:1 to about 10:1, or from about 1:1 to about 5:1, or any sub range or value herein. In some embodiments, the third time period of the recovery state is longer than either the first or second time period, so that the electron temperature may drop. When the electron temperature drops, it correlates to a lower ion temperature, which allows for better directional control when etching.

The three state etch pulse (505-512) that includes first a bias state (506, 508), followed by a source state (510, 511), and followed by a recovery state (512) has been found to provide improved directional control for etching a sample, and in particular for etching a sample comprising an alternating stack of Si and SiGe layers when used with an $SiCl_4$ chemistry.

After the third time period, the sample/article may be checked to see if target amount has been etched at block 513. Alternatively, or additionally, a determination may be made whether a target amount of the sample/article has been etched based on an amount of time that the etch process has been executed. If the etch process has not been performed for a target amount of time (e.g., according to an etch recipe), then the target amount of the sample/article may not have been etched yet. If the target amount of the sample/article has not been etched, then the plasma etch pulse process of blocks 504 to 512 may be repeated. If the target amount of the sample/article has been etched, then the sample/article is removed from the etch chamber in block 514.

The pulsed plasma etch process set forth in method 500 achieves a low plasma density due to performing the bias state prior to the source state, and due to use of a long recovery state (e.g., that is more than 50% of the total time for a pulse). At high plasma density (e.g., as would be achieved with a continuous wave source power), etch rate is decreased due to increased deposition from feed gas (SiCl$_4$), which is undesirable. However, the low plasma density that is achieved in embodiments results in an increased etch rate, i.e. approximately 0.1 nm/sec. Additionally, the pulsed scheme described herein generates a highly directional ion flux with lower plasma density in the bias state, while maintaining the low plasma density in the recovery state.

FIG. 6 illustrates a plasma etch pulse cycle according to an embodiment of the present disclosure. In FIG. 6, the plasma etch pulse cycle has three states. In the first state, a bias state 605 is achieved. The bias state 605 may be achieved according to block 506 as described in reference to FIG. 5. The second state of FIG. 6 is a source state 610. The source state may be achieved according to block 510 as described in reference to FIG. 5. The third state of the plasma etch pulse is a recovery state 615. The recovery state may be achieved as described in blocks 511 and 512 in reference to FIG. 5. In FIG. 6, the duration of time for the bias state 605 may be about 2% to about 10%, or about 5% of the plasma etch pulse cycle. The duration of time for the source state 610 may be about 2% to about 10%, or about 5% of the plasma etch pulse cycle, while the duration of time for the recovery state 615 is about 80% to about 96%, or about 90% of the plasma etch pulse cycle.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method of etching a sample comprising:
performing a plasma etch pulse, comprising:
directing a gas flow comprising silicon tetrachloride (SiCl$_4$) and a diluent comprising Ar and He towards the sample;
applying a bias power to achieve a bias state for a first time period while directing the flow of the SiCl$_4$ and the diluent towards the sample;
applying a source power to achieve a source state for a second time period; and
applying no bias power and no source power to achieve a recovery state for a third time period; and
repeating the plasma etch pulse until a target amount of the sample has been etched.

2. The method of claim 1, wherein no source power is applied during the bias state and wherein no bias power is applied during the source state.

3. The method of claim 1, wherein the bias power is from about 100 W to about 5000 W.

4. The method of claim 1, wherein a bias frequency is from about 400 kHz to about 60 MHz.

5. The method of claim 1, wherein the plasma etch pulse is performed at a pressure of about 0.1 mT to about 500 mT.

6. The method of claim 1, wherein the plasma etch pulse is performed at a temperature of about −50° C. to about 300° C.

7. The method of claim 1, wherein the source power is from about 100 W to about 5000 W.

8. The method of claim 1, wherein the gas flow comprises SiCl$_4$ in an amount of about 5 mol % to about 80 mol %.

9. The method of claim 1, wherein the gas flow comprises Ar in an amount of about 5 mol % to about 15 mol % and He in an amount of about 5 mol % to about 90 mol %.

10. The method of claim 1, wherein the first time period is about 10 μsec to about 1 msec, wherein the second time period is about 10 μsec to about 1 msec, and wherein the third time period is about 10 μsec to about 1 msec.

11. The method of claim 1, where a ratio of the first time period to the second time period is about 1:10 to about 10:1.

12. The method of claim 1, wherein a ratio of the third time period to an aggregate of the first time period and the second time period is about 1:1 to about 90:1.

13. The method of claim 1, wherein the gas flow has a rate of about 50 sccm to about 2000 sccm.

14. The method of claim 1, wherein a portion of the sample that is etched by the plasma etch pulse comprises a plurality of alternating layers of silicon and silicon germanium.

15. The method of claim 1, wherein the plasma etch process causes a U-shaped profile in the sample.

16. A method of etching a sample, comprising:
performing a plasma etch pulse, comprising:
applying a bias power to achieve a bias state for a first time period while directing a flow of a gas and a diluent towards the sample;
applying a source power to achieve a source state for a second time period; and
applying no bias power and no source power to achieve a recovery state for a third time period; and
repeating the plasma etch pulse until a target amount of the sample has been etched,
wherein no source power is applied during the bias state and wherein no bias power is applied during the source state and
wherein the gas comprises $SiCl_4$ and the diluent comprises Ar and He.

* * * * *